United States Patent
Champion

(10) Patent No.: US 7,558,275 B2
(45) Date of Patent: Jul. 7, 2009

(54) SYSTEM AND METHOD FOR CLOCK REPLICATION USING REFERENCE CLOCK

(75) Inventor: Mark Champion, Kenmore, WA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 581 days.

(21) Appl. No.: 11/226,087

(22) Filed: Sep. 13, 2005

(65) Prior Publication Data

US 2007/0058078 A1  Mar. 15, 2007

(51) Int. Cl.
*H04L 12/28* (2006.01)

(52) U.S. Cl. .................. 370/395.62; 370/503; 348/138; 348/512

(58) Field of Classification Search .................. 370/468, 370/477, 503, 229, 230, 230.1, 231, 310, 370/395.62; 348/473, 512, 518, 138, 500, 348/537, E7.021, E7.02; 340/5.63; 386/E9.062
See application file for complete search history.

(56) References Cited

U.S. PATENT DOCUMENTS

| | | | | |
|---|---|---|---|---|
| 4,393,413 A * | 7/1983 | Kaneko | ....................... | 386/13 |
| 4,672,447 A * | 6/1987 | Moring et al. | .............. | 348/537 |
| 4,694,327 A * | 9/1987 | Demmer et al. | ............. | 348/508 |
| 4,912,549 A * | 3/1990 | Altman et al. | .............. | 348/496 |
| 5,270,816 A * | 12/1993 | Citta et al. | .................. | 348/470 |
| 5,953,311 A * | 9/1999 | Davies et al. | ................ | 370/210 |
| 6,144,668 A * | 11/2000 | Bass et al. | ................... | 370/401 |
| 6,310,653 B1* | 10/2001 | Malcolm et al. | ............ | 348/537 |
| 6,333,939 B1* | 12/2001 | Butler et al. | ................. | 370/503 |
| 6,917,388 B2* | 7/2005 | Naka et al. | ................... | 348/537 |
| 7,016,443 B1 | 3/2006 | Splett | | |
| 7,035,247 B2 | 4/2006 | Ofek et al. | | |
| 7,050,450 B1 | 5/2006 | Hennen et al. | | |
| 7,295,578 B1* | 11/2007 | Lyle et al. | .................... | 370/503 |
| 2002/0090004 A1* | 7/2002 | Rinchiuso | ................... | 370/468 |
| 2002/0093592 A1* | 7/2002 | Naka et al. | .................. | 348/537 |
| 2004/0062244 A1* | 4/2004 | Gil et al. | ..................... | 370/392 |
| 2004/0080671 A1* | 4/2004 | Siemens et al. | ............. | 348/473 |
| 2005/0129047 A1* | 6/2005 | Ku et al. | ..................... | 370/428 |
| 2006/0012711 A1* | 1/2006 | Champion et al. | .......... | 348/518 |
| 2006/0209890 A1* | 9/2006 | MacMullan et al. | ......... | 370/468 |
| 2006/0209892 A1* | 9/2006 | MacMullan et al. | ......... | 370/468 |
| 2007/0237070 A1* | 10/2007 | Geile et al. | ................. | 370/208 |
| 2007/0291856 A1* | 12/2007 | Fastert et al. | ........... | 375/240.28 |

* cited by examiner

*Primary Examiner*—Aung S Moe
*Assistant Examiner*—Abdullah Riyami
(74) *Attorney, Agent, or Firm*—Crowell & Moring LLP

(57) ABSTRACT

Data encoded with a video clock is transmitted over a communication link in accordance with a communication reference signal, which in one embodiment is a wireless link. In one embodiment, the video clock is independent from the communication reference signal. The communication reference clock, which may be known to both the transmitter and receiver, is used to determine a frame period. On the receiver-side, the number of video cycles of the video data which are actually received are counted. The video clock may then be regenerated using the determined frame period and counted video clock cycles.

20 Claims, 3 Drawing Sheets

SYSTEM AND METHOD FOR CLOCK REPLICATION USING REFERENCE CLOCK

FIELD OF THE INVENTION

The invention relates in general to communication frequency clocks, and in particular, to using a reference clock to replicate an independent clock.

BACKGROUND OF THE INVENTION

There are ever increasing applications which require that video data, including high definition (HD) video, be transmitted over wireless paths. For instance, HD video may be transmitted over wireless digital visual interface (DVI) paths from a source to a player.

Regardless of how the data is transmitted, the use of two clocks may be required when the video clock rate is different from a reference clock rate. The video clock refers to the rate at which the video data is encoded at a source and then decoded at a display, while and the reference clock refers to the clock rate of the transmission system itself. The difficulty arises from the fact that the source of video on the transmitter side and the video player on the receiver side must use the same video clock for encoding/decoding. Similarly, the transmitter and receiver of the communication system must use the same reference clock.

While it is well known how the transmitter and receiver in a communication system are able to maintain the reference clock, it is a more difficult task to ensure that the video clock is properly maintained. One approach has been to simply require the video clock to be related in some predefined way to the reference clock. This way, there is no need to transmit any information about the video clock with the data, since the receiver system knows the predefined relationship the video clock has with the communication clock and can simply derive the video clock from the communication clock. Unfortunately, the requirement that the clock of the video system bear a predefined relationship to the clock of the communication system unnecessarily constrains the video system, and/or renders some video systems, which have video clocks that are established independently and arbitrarily from any communication system clock, unsuitable for transmission over the communication system.

Another approach has been to have the transmitter continuously monitor the video clock by counting the number of video clocks occurring in a given transmission time period. This "count" would then be serialized onto the video data and sent over the communication link along with the video data. This "count" would then be used by the receiver to recover the video clock. While this is an improvement to requiring a predefined relationship between the video clock and the reference clock, it requires a more complicated transmission system since the "count" has to be continuously sent to the receiver side. In addition, this approach requires that forward error correction techniques be used to ensure that the "count" is being accurately transmitted over a potentially unreliable communication link.

Thus, there is still an unsatisfied need for a system and method for using reference clock to replicate an independent video clock.

SUMMARY OF THE INVENTION

Systems and methods for clock replication using a reference clock are disclosed and claimed herein. In one embodiment, a method includes receiving data encoded with a data clock signal over a communication link according to a communication reference clock, counting a number of data clock cycles received over the communication link, and determining a frame period for the data using the communication reference clock. The method further includes regenerating the data clock signal using the number of data clock cycles and the frame period.

Other embodiments are disclosed and claimed herein.

DETAILED DESCRIPTION OF THE EXEMPLARY EMBODIMENTS

The disclosure relates to a transmitter-receiver system in which data (e.g., video data) is transmitted over a communication link, which in one embodiment is a wireless link. One aspect of the invention is to regenerate a video clock used to encode video data without having to transmit the clock data along with the video to the receiver. In one embodiment, the video clock is independent of a reference clock of the communication system which is used to transmit the video data.

Another aspect is to count, on the receiver-side, a number of video cycles of the video data which are actually received. In one embodiment, the aforementioned communication reference clock is used to determine a frame period for the received video data. Using the counted video clock cycles and the determined frame period, the video clock can be regenerated on the receiver-side and used to decode the video data accordingly. In one embodiment, the frequency of the video clock is given by $F=n/p$, where n is the number of video cycles contained in a data frame and p is the frame period.

In another embodiment, a phase-locked loop filter in a frequency synthesizer may be used to reduce video jitter. Alternatively, a time averaging method can also be used to reduce jitter. While the present disclosure is written in terms of video data, it should equally be appreciated that the invention may be applicable to any system in which a frequency accurate clock must be transported (or reproduced) over a digital communication link in which the data rate is not related to the transported clock.

Figure 1:
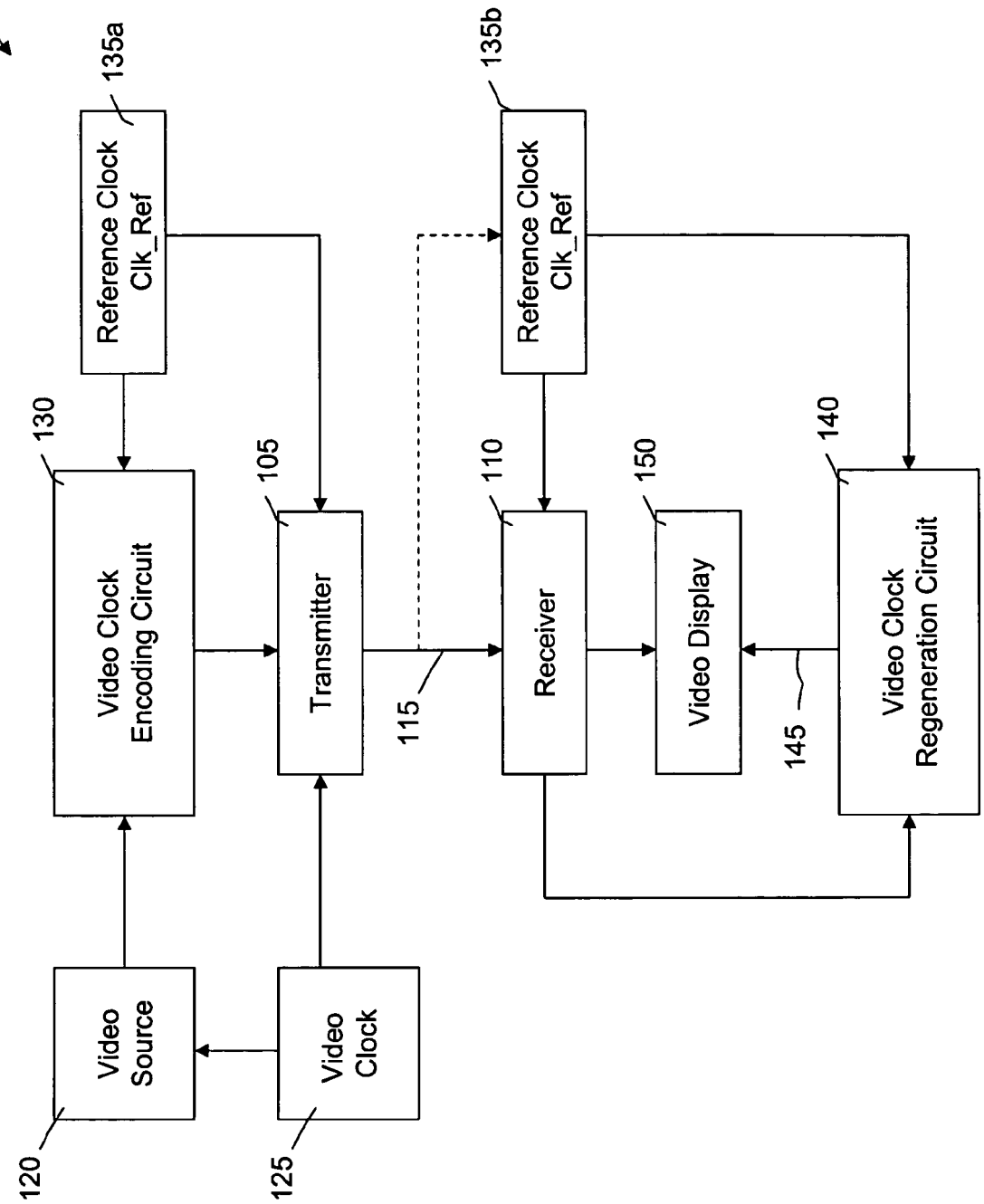
FIG. 1 is a system diagram of one embodiment of how the invention may be implemented.

Referring now to FIG. 1, one embodiment of a system 100 is shown, including a transmitter 105 communicating with a receiver 110 along a communication link 115. While it should be appreciated that the invention can be applied to convey an arbitrary clock using a reference clock across any communication path, in one non-limiting embodiment the transmitter 105 sends a high definition (HD) video signal to the receiver 110 across a wireless transmission link 115.

As shown in FIG. 1, the transmitter 105 receives input from reference clock 135a, whereas receiver 110 receives input from reference clock 135b, which in one embodiment, recovers the reference clock signal from the transmitted signal itself. Thus, reference clocks 135a and 135b are "locked" in the sense that they operate at the same frequency using a clock signal generally known to both the transmitter 105 and receiver 110.

Continuing to refer to FIG. 1, the video from video source 120 may be encoded using a video clock 125. This may be accomplished using a video clock encoding circuit 130, which receives input from the video source 120 and the reference clock 135a and which sends an output to the transmitter 105 for transmission thereof to the receiver 110. In one embodiment, the video clock 125 does not bear any predefined relationship to the reference clock, and the receiver 110 need not know the video clock 125 a priori, but rather can recover the video clock using the reference clock 135b in accordance with the principles of the invention.

The video clock may then be recovered on the receiver-side by a video clock recovery circuit 140, which receives input from the reference clock 135b and which provides, as output, the recovered video clock 145 to a device requiring knowledge of the video clock 125, e.g., a video display 150 such as but not limited to a HDTV.

Figure 2:
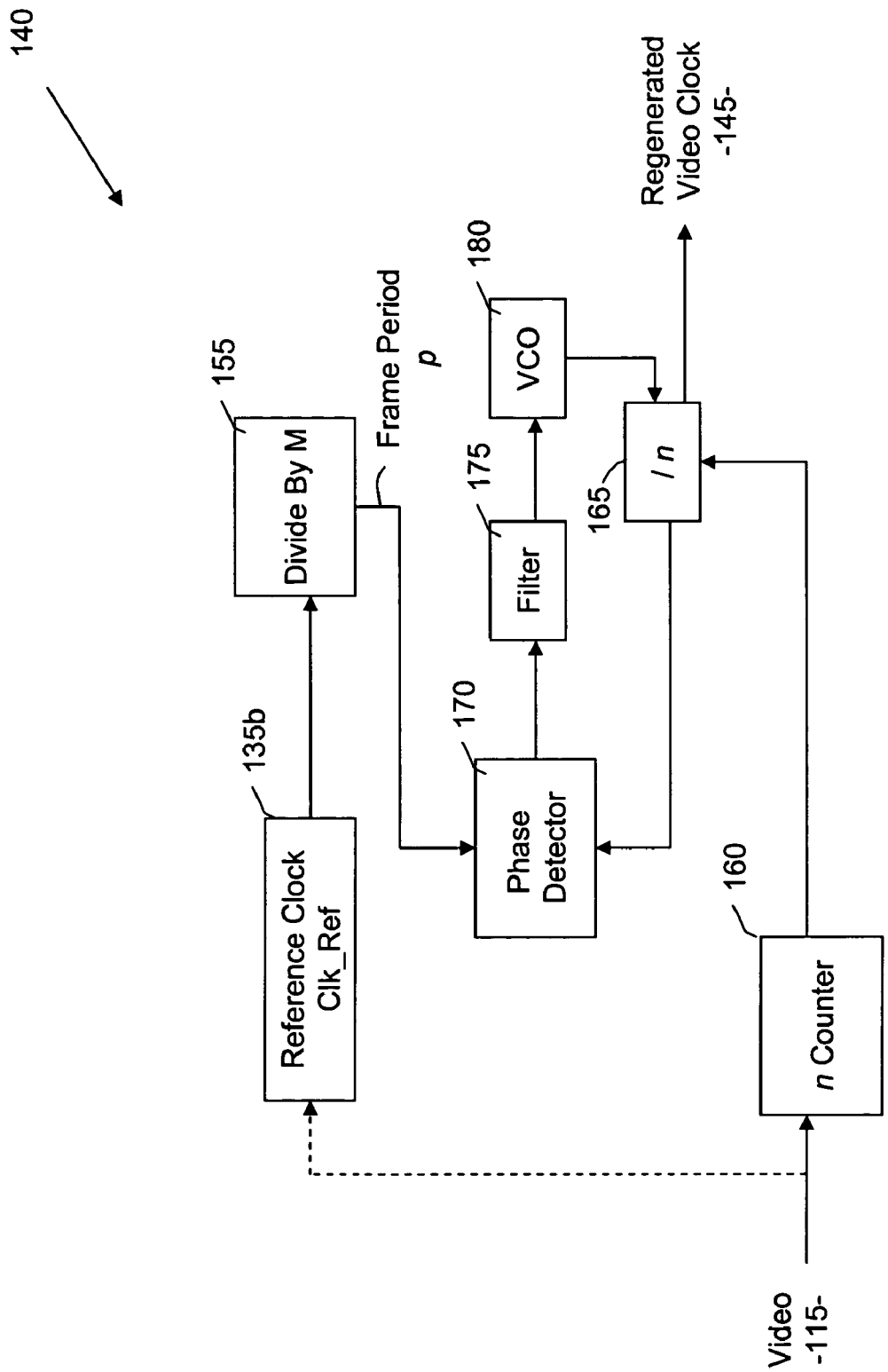
FIG. 2 is a system diagram of the video clock regeneration circuit of FIG. 1, according to one embodiment.

FIG. 2 shows a non-limiting exemplary implementation of the video clock regeneration circuit 140. As shown, in the video clock regeneration circuit 140 the reference clock 135b is used to establish a frame period a dividing element 155 which divides the Clk_Ref by an integer "m" to obtain a frame period, also referred to as a "frame clock", that is thus some fraction of the reference clock period. While in one embodiment this integer "m" may be one, in other embodiments it may range from between 200 and 2000. In one embodiment, "m" is constant and is known to both the video clock encoding circuit 130 and video clock regeneration circuit 140. As previously mentioned, in one embodiment of the invention the Clk_Ref is independent from the video clock to be regenerated.

Continuing to refer to FIG. 2, every frame period, i.e., for each frame clock cycle, an n counter 160 receives the video over communication link 115 and counts the number of video clock cycles. This number is represented in FIG. 2 by the integer "n", and is the number of the video clock cycles within the frame period.

Unlike prior methods which may multiplex the n value onto the video stream, one aspect of the invention is to determine n on the receiver-side, thereby eliminating the need to continuously track the number of video clock cycles "n" on the transmitter-side.

With respect to the video clock regeneration circuit 140 of FIG. 2, "n" values computed by the n counter 160 are sent to an n-dividing element 165, which divides by "n". Also, from the received signal the reference clock 135b is recovered and sent to the previously-mentioned m-dividing element 155, which divides the reference clock by "m" to render the frame period.

In the non-limiting embodiment shown in FIG. 2, the outputs of the dividing elements 155 and 160 are input to a phase detector 170. In one embodiment, the phase detector 170 may determine the phase differences between these inputs and provides an output to a filter 175. In turn, the filter 175 filters the output of the phase detector 170 in accordance with phase-locked loop filtering principles to provide a filtered input to a voltage controlled oscillator (VCO) 180. The output of the VCO 180 may then be divided by the continuously updated "n" value to render the recovered video clock 145 for use by the video display 150 as shown in FIG. 1. Thus, the video clock used by the video display 150 is continuously updated using the above principles.

While the aforementioned figures show that the present logic implemented in hardware, in some embodiments it may be implemented in software that can be stored in memory and executed by a computer. In another embodiment, the logic may be implemented using a combination of hardware and software.

Figure 3:
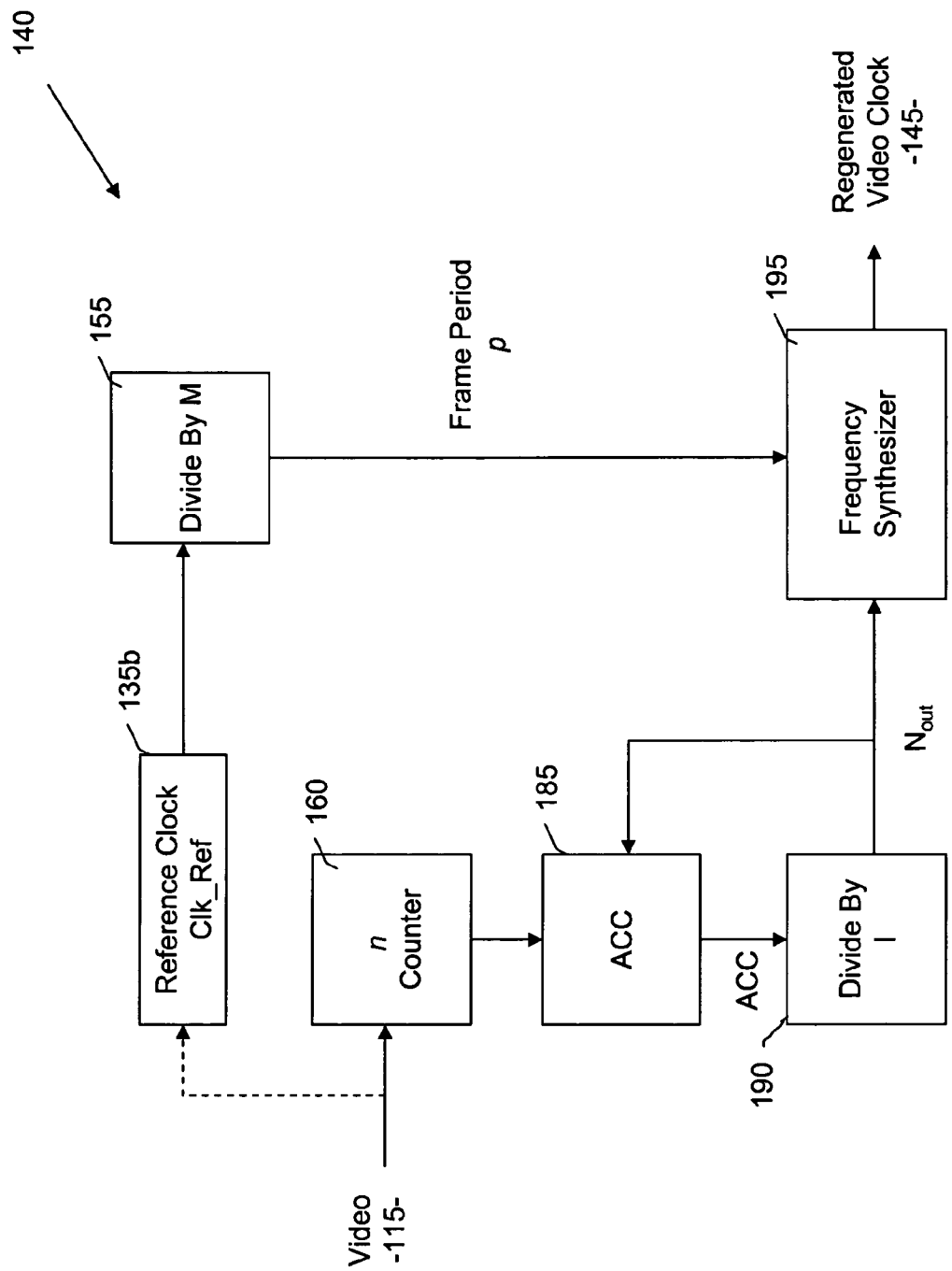
FIG. 3 is a system diagram of the video clock regeneration circuit of FIG. 1, according to another embodiment.

Referring now to FIG. 3, depicted is another embodiment of the video clock regeneration circuit 140 of FIG. 1. As with the embodiment of FIG. 2, the video clock regeneration circuit 140 of FIG. 3 uses the reference clock 135b to establish a frame period using a dividing element 155 which divides the Clk_Ref by an integer "m" to obtain the frame period, also referred to as a "frame clock", that is thus some fraction of the reference clock period. Again, this integer "m" may be one, or any other value between 200 and 2000.

Continuing to refer to FIG. 3, every frame period, i.e., for each frame clock cycle, an n counter 160 receives the video over communication link 115 and counts the number of video clock cycles. This number is represented in FIG. 3 by the integer "n", and is the number of the video clock cycles within the frame period.

Unlike the embodiment of FIG. 2 which uses phase detector in conjunction with a special filter, the embodiment of FIG. 3 uses a time averaging method to reduce jitter. In particular, the n counter 160 provides a signal to an accumulator (ACC) element 185, which maintains an accumulated n value.

With each received data frame, a new n value is counted and added to the ACC element 185 (i.e., $ACC_i = ACC_{i+1} + n$). After each successive n value is added, the ACC element 185 provides the new ACC value to dividing element 190 where the ACC value is divided by some integer I (i.e., $N_{out} = ACC/I$). While in one embodiment, I is 4 it may also be any integer value from between 2 and 256. The output from dividing element 190 may then be provided to the frequency synthesizer 195.

In one embodiment, the function of frequency synthesizer 195 is to regenerate the video clock and to provide the regenerated video clock 145 to the attached video display 150. This is accomplished by the frequency synthesizer 195 according to the formula $F = N_{out}/p$, according to one embodiment, where $N_{out}$ is the averaged count value and p is the period of the data frame provided by the dividing element 155.

In addition to providing the updated $N_{out}$ value to the frequency synthesizer 195, it may also be provided to the ACC element 185 as part of a feedback loop. When the value is provided back to the ACC element 185, it is subtracted from the then-current accumulated n value (i.e., $ACC_i = ACC_{i+1} - N_{out}$). Thus, the sum of the Nout values will converge to the sum of the input n values. This averaging technique will ensure that $N_{out}$ will not change by more than one, assuming that the input n values do not change by more than I (e.g., 4). It should equally be appreciated that other averaging techniques may be used to reduce jitter.

While the invention has been described in connection with various embodiments, it will be understood that the invention is capable of further modifications. This application is intended to cover any variations, uses or adaptations of the invention following, in general, the principles of the invention, and including such departures from the present disclosure as, within the known and customary practice within the art to which the invention pertains.

What is claimed is:

1. A method of regenerating a data clock signal comprising:
   receiving data encoded with said data clock signal over a communication link according to a communication reference clock;
   counting a number of data clock cycles received over said communication link;
   determining a frame period for said data using said communication reference clock;
   regenerating said data clock signal using said number of data clock cycles and said frame period; and
   reducing jitter in said data by time averaging said number of data clock cycles, wherein said time averaging includes:
   (a) adding values for said number of data clock cycles to provide an accumulated value,
   (b) dividing said accumulated value by an integer to provide an averaged value, (c) using said averaged value to perform said regenerating,
(d) subtracting said averaged value from said accumulated value to provide an updated accumulated value, and
(e) repeating (a)-(e) on a continuous basis.

2. The method of claim 1, wherein said communication link is a wireless communication link.

3. The method of claim 1, wherein said data is high definition video data, and said data clock signal is associated with an encoding process of said high definition video data.

4. The method of claim 1, wherein said data clock signal is not based on said communication reference clock.

5. The method of claim 1, wherein said regeneration further comprises using a phase detector to i) receive a first value representative of said communication reference signal, ii) receive a second value representative of said number of data clock cycles, and iii) provide an input to a voltage controlled oscillator, said voltage controlled oscillator outputting a signal representative of said data clock signal.

6. The method of claim 1, wherein determining the frame period comprises dividing said communication reference clock by a predetermined integer that is between 200 and 2000.

7. The method of claim 1, further comprising:
updating, continuously, said number of data clock cycles; and
updating, continuously, said data clock signal based on said continuously updated number of data clock cycles.

8. A method of regenerating a video clock signal comprising:
receiving video data encoded with said video clock signal over a communication link, said communication link having a communication reference clock associated therewith that is independent of said video clock signal, and said video data being encoded with said video clock signal prior to being transmitted over said communication link;
counting, by a receiver-side device, a number of video clock cycles of said video data received over said communication link;
determining a frame period for said video data using said communication reference clock;
regenerating, by said receiver side device, said video clock signal using said number of video clock cycles and said frame period; and
reducing jitter in said video data by time averaging said number of video clock cycles, wherein said time averaging includes:
(a) adding values for said number of video clock cycles to provide an accumulated value,
(b) dividing said accumulated value by an integer to provide an averaged value,
(c) using said averaged value to perform said regenerating,
(d) subtracting said averaged value from said accumulated value to provide an undated accumulated value, and
(e) repeating (a)-(e) on a continuous basis.

9. The method of claim 8, wherein said communication link is a wireless communication link.

10. The method of claim 8, wherein said video data is high definition video data, and said video clock signal is associated with an encoding process of said high definition video data.

11. The method of claim 8, wherein said regeneration further comprises:
receiving, by a phase detector, a first value representative of said communication reference signal; and
receiving, by a phase detector, a second value representative of said number of video clock cycles; and
providing input to a voltage controlled oscillator, wherein said voltage controlled oscillator is to output a signal representative of said video clock signal.

12. The method of claim 8, wherein determining the frame period comprises dividing said communication reference clock by a predetermined integer that is between 200 and 2000.

13. The method of claim 8, further comprising:
updating, continuously, said number of video clock cycles; and
updating, continuously, said video clock signal based on said continuously updated number of video clock cycles.

14. A system for regenerating a data clock signal comprising:
a transmitter to transmit data encoded with said data clock signal; and
a receiver to receive said data over a communication link, said communication link having a communication reference clock that is not based on said data clock signal, said receiver to,
count a number of data clock cycles received from said transmitter over said communication link;
determine a frame period for said data using said communication reference clock;
regenerate said data clock signal using said number of data clock cycles and said frame period; and
reduce jitter in said data by time averaging said number of data clock cycles, wherein the receiver is configured to perform said time averaging by:
(a) adding values for said number of data clock cycles to provide an accumulated value,
(b) dividing said accumulated value by an integer to provide an averaged value,
(c) using said averaged value to perform said regenerating,
(d) subtracting said averaged value from said accumulated value to provide an undated accumulated value,
(e) repeating (a)-(e) on a continuous basis.

15. The system of claim 14, wherein said communication link is a wireless communication link.

16. The system of claim 14, wherein said data is high definition video data, and said data clock signal is associated with an encoding process of said high definition video data.

17. The system of claim 14, wherein said receiver is coupled to a display device, and said regenerated data clock signal is provided to said display device to decode said data.

18. The system of claim 14, wherein said receiver further includes a phase detector to:
receive a value representative of said communication reference signal;
receive a value representative of said number of data clock cycles; and
output a phase shift signal to a voltage controlled oscillator, wherein said voltage controlled oscillator, in response to said phase shift signal, is to output a signal representative of said data clock signal.

19. The system of claim 14, wherein said receiver is to determine said frame period by dividing said communication reference clock by a predetermined integer that is between 200 and 2000, wherein said integer is known to both said transmitter and said receiver.

20. The system of claim 14, wherein said receiver is further to continuously update said number of data clock cycles, and continuously update said data clock signal based on said continuously updated number of data clock cycles.

* * * * *